United States Patent [19]

Nguyen et al.

[11] Patent Number: 5,578,970

[45] Date of Patent: Nov. 26, 1996

[54] BICMOS MONOLITHIC MICROWAVE OSCILLATOR USING NEGATIVE RESISTANCE CELL

[76] Inventors: Thai M. Nguyen, 2540 Elliot Ct., Santa Clara, Calif. 95051; David E. Bien, 966 Azalea Dr., Sunnyvale, Calif. 94086

[21] Appl. No.: 34,947

[22] Filed: Mar. 19, 1993

[51] Int. Cl.$^6$ ...................................................... H03B 7/14
[52] U.S. Cl. .................... 331/75; 331/115; 331/117 D; 331/117 FE
[58] Field of Search ................................ 331/96, 107 DP, 331/115, 117 D, 117 FE, 74, 75

[56] References Cited

U.S. PATENT DOCUMENTS

| | | | |
|---|---|---|---|
| 3,775,698 | 11/1973 | Nugent et al. | 331/117 FE |
| 4,189,688 | 2/1980 | Sechi et al. | 331/117 FE |
| 4,511,861 | 4/1985 | Bell | 331/108 R |
| 4,630,003 | 12/1986 | Torizuka et al. | 331/115 |
| 5,157,356 | 10/1992 | Wedge | 331/60 |
| 5,341,111 | 8/1994 | Miya et al. | 331/96 |

OTHER PUBLICATIONS

Rhea, R. W., *Oscillator Design and Computer Simulation*, Prentice Hall, Chap. 2, pp. 51–57 (1990). (month unknown).

Gonzalez, G., *Microwave Transistor Amplifiers Analysis and Design*, Prentice hall, Chap. 5, pp. 194–214 (1984). (month unknow).

Bahl, I., et al., *Microwave Solid State Circuit Design*, John Wiley & Sons, Inc., Chap. 9, pp. 426–481 (1988). (month unknown).

Liao, S. Y., *Microwave Circuit Analysis and Amplifier Design*, Prentice Hall, Chap. 9, pp. 320–363 (1987). (month unknown).

Mayle, E. E., et al., "Varactorless VCO Design Utilizes AGC Transistor," *Microwaves & RF*, pp. 101–102, 104 (Jul., 1991).

Chi, C. Y. et al., "Switched Resonators Boost the Bandwidth of Microwave VCOs," pp. 131–132, 136–138, 140 (May, 1990).

*Primary Examiner*—Andrew M. Dolinar

[57] ABSTRACT

A monolithic microwave oscillator using a negative resistance cell includes a resonator, a negative resistance cell that employs an active device, an output buffer for voltage and current amplification, and a field effect transistor. The negative resistance cell includes a bipolar junction transistor as its active device, with the output buffer circuit coupled to a base of the BJT through the field effect transistor. The combination of the resonator and the negative resistance cell produce a periodic RF microwave signal that is sampled, amplified and buffered by the buffer circuit without degradation.

4 Claims, 9 Drawing Sheets

BICMOS MONOLITHIC MICROWAVE OSCILLATOR USING NEGATIVE RESISTANCE CELL

BACKGROUND OF THE INVENTION

The present invention relates generally to integrated circuits for microwave devices. More specifically, the present invention relates to a microwave oscillator using a negative resistance cell integrated on a monolithic substrate using BiCMOS fabrication techniques.

Negative resistance cells are well known in the art for use in an active circuit to provide an oscillating system for generation of periodic output signals. FIG. 5 is a block diagram or a conventional negative resistance oscillator 100 having a resonance circuit 102 coupled to an active circuit 104. The combination of the resonance circuit 102 and the active circuit 104 produce an oscillator. Gonzalez, *Microwave Transistor Amplifiers*, Prentice Hall, 1989, chapter 5, pages 194–199 describe microwave transistor oscillator design and operation in more detail, and is hereby expressly incorporated by reference for all purposes.

FIG. 6 is a block diagram of oscillator 100 showing further detail. Resonance circuit 102 includes an impedance 110, an inductance 112, and a capacitance 114, all coupled in parallel between an output port 116 and ground 118. Active circuit 104 includes a negative resistance cell 120 connected to output port 116, ground 118, and an output circuit 122. Output circuit 122 includes a series connected capacitance 124 and a load resistance 126 that couples negative resistance cell 120 to RF output port 130. The capacitance 124 blocks DC current.

FIG. 7 is a schematic diagram of a preferred embodiment of basic negative resistance cell 120 shown in FIG. 6. Negative resistance cell 120 includes a bipolar junction NPN transistor 150, having a parallel connected impedance 152 and a capacitance 154 coupled between its emitter and ground 118. The collector of transistor 150 connects to power. Vcc. The base of transistor 150 couples through impedance 160 to Vcc, and through impedance 162, ground 118. The base of transistor 150 couples directly to resonance circuit 102.

Oscillator 100 includes output buffer 122 coupled to the collector of transistor 150. One problem with oscillator 100 shown in FIG. 6 is that a phenomenon known as Miller capacitance existing between the collector and the base of transistor 150 couples any voltage variations at node 170 back to the base of the transistor. These voltage variations influence the oscillation frequency, and thereby affect the output of oscillator 100. To address this difficulty, conventional designs of oscillator 100 include differing buffering systems coupling the RF output to the collector of transistor 150 of the negative resistance cell 120. FIG. 8—FIG. 10 show different embodiments of the prior art to address buffering of the output signal.

FIG. 8 is a schematic diagram of one conventional approach to buffer the to output signal of oscillator 100 having a modified active circuit 104'. Active circuit 104' includes a buffer 122'. Buffer 122' includes an NPN transistor 200. and NPN transistor 202, current sources 204 and 206, and impedances 208 and 210. Buffering system 122' shown in FIG. 8 is susceptible to the Miller capacitance problem that degrades the function of oscillator 100.

FIG. 9 is a schematic diagram of one conventional approach to buffer the output signal of oscillator 100 having a modified active circuit 104". Active circuit 104" is similar to active circuit 104' and it includes an NPN transistor 220 between impedance 208 and NPN transistor 150 of negative resistance cell 120, providing a cascade configuration. The base of NPN transistor 200 is coupled to the collector of NPN transistor 220. NPN transistor 220 serves to isolate the buffer and amplifier circuitry from the base of negative resistance cell transistor 150. The system shown in FIG. 9 requires a Vcc greater than 3 volts for effective operation, and is therefore undesirable for use in circuits that are to operate at less than 3 volts, such as required for the currently emerging semiconductor standard.

FIG. 10 is a schematic diagram of one conventional approach to buffer the output signal of oscillator 100 having a modified active circuit 104'''. Active circuit 104''' is similar to active circuit 104' and includes a buffer circuit 122'''. The buffer 122''' includes an isolating bipolar transistor 250 having a base connected to the base of transistor 150. The collector of transistor 250 connects to Vcc, while an impedance 252 couples the emitter of transistor 250 to ground. Buffer 122''' includes a second transistor 254, for amplification. The base of transistor 252 connects to the emitter of transistor 250 and its emitter connects to ground. An impedance 256 couples Vcc to the collector of transistor 254. An impedance 258 couples the collector of transistor 254 to the RF output port.

While the configuration shown in FIG. 10 is operable and can be adjusted to function at a desired oscillation frequency, the circuit has characteristics that degrade its design and stability. This characteristic includes the observation that the capacitances associated with transistor 254, i.e. its $c_{bc}$ and $c_{be}$ parasitic capacitances, can be combined and modeled as a capacitance in parallel with impedance 252. This combination causes transistor 250 to act as a negative resistance cell. When transistor 250 acts like a negative resistance cell, its presence alters a theoretical oscillation frequency determined solely by negative resistance cell 120 and the resonance circuit 102. A design must account for more variables in order to obtain a desired oscillation frequency, resulting in an oscillator that is more difficult to control.

SUMMARY OF THE INVENTION

The present invention provides apparatus and method for simple, efficient and economic production of microwave radiation while overcoming some of the disadvantages of the prior art. The present invention provides a monolithic substrate incorporating elements of the novel microwave elements on a single semiconductor substrate. The preferred embodiment of the present invention allows for an improved microwave oscillator that uses a negative resistance cell while remaining more stable, less costly and having reduced space requirements than prior an devices, especially those prior art devices that employ discrete devices.

According to one aspect of the invention, it includes a resonator, a negative resistance cell, and an output buffer all coupled to the resonator by a field effect transistor, with elements integrated on a monolithic semiconductor substrate and manufactured using a BiCMOS fabrication process. The negative resistance cell of the preferred embodiment includes a bipolar junction transistor having a base connected to the resonator. The field effect transistor is also connected to the base of transistor of the negative resistance cell.

In operation, the resonator and the negative resistance cell cooperate to produce a periodic signal at a desired frequency. The output buffer taps the periodic signal through the field effect transistor coupled to the resonator/negative resistance cell combination. The high input impedance of the gate of the field effect transistor isolates the output buffer from the resonating signal of the resonator. The output buffer does not interfere with the oscillation frequency. In the preferred embodiment, the output buffer, either alone or in conjunction with the FET, provides any desired amplification. The active device in the negative resistance cell is no longer used to amplify the output RF signal.

Other features improvements and benefits may be realized by reference to the remaining parts of the specification, including the drawings.

DESCRIPTION OF THE PREFERRED EMBODIMENTS

Figure 1:
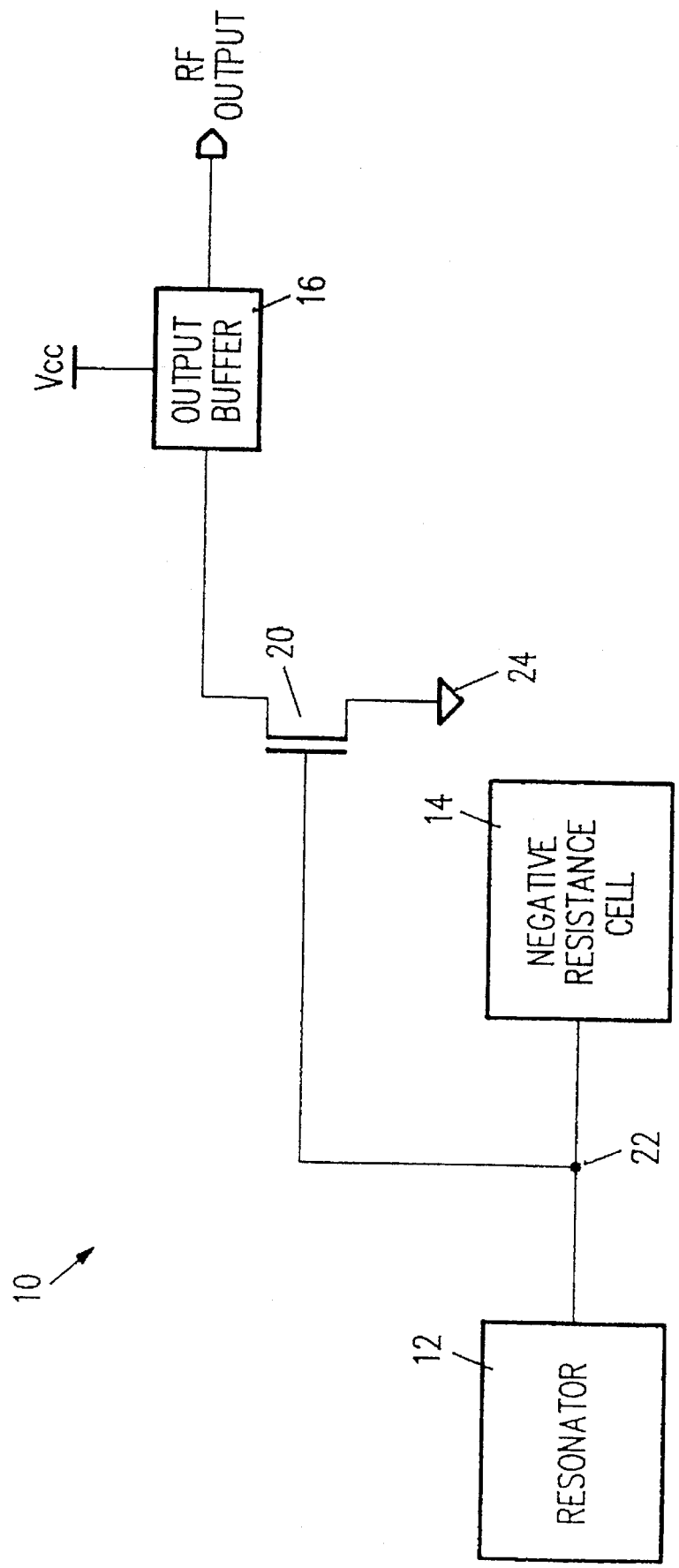
FIG. 1 is a block diagram of a preferred embodiment of a microwave oscillator 10 according to the present invention.
Figure 7:
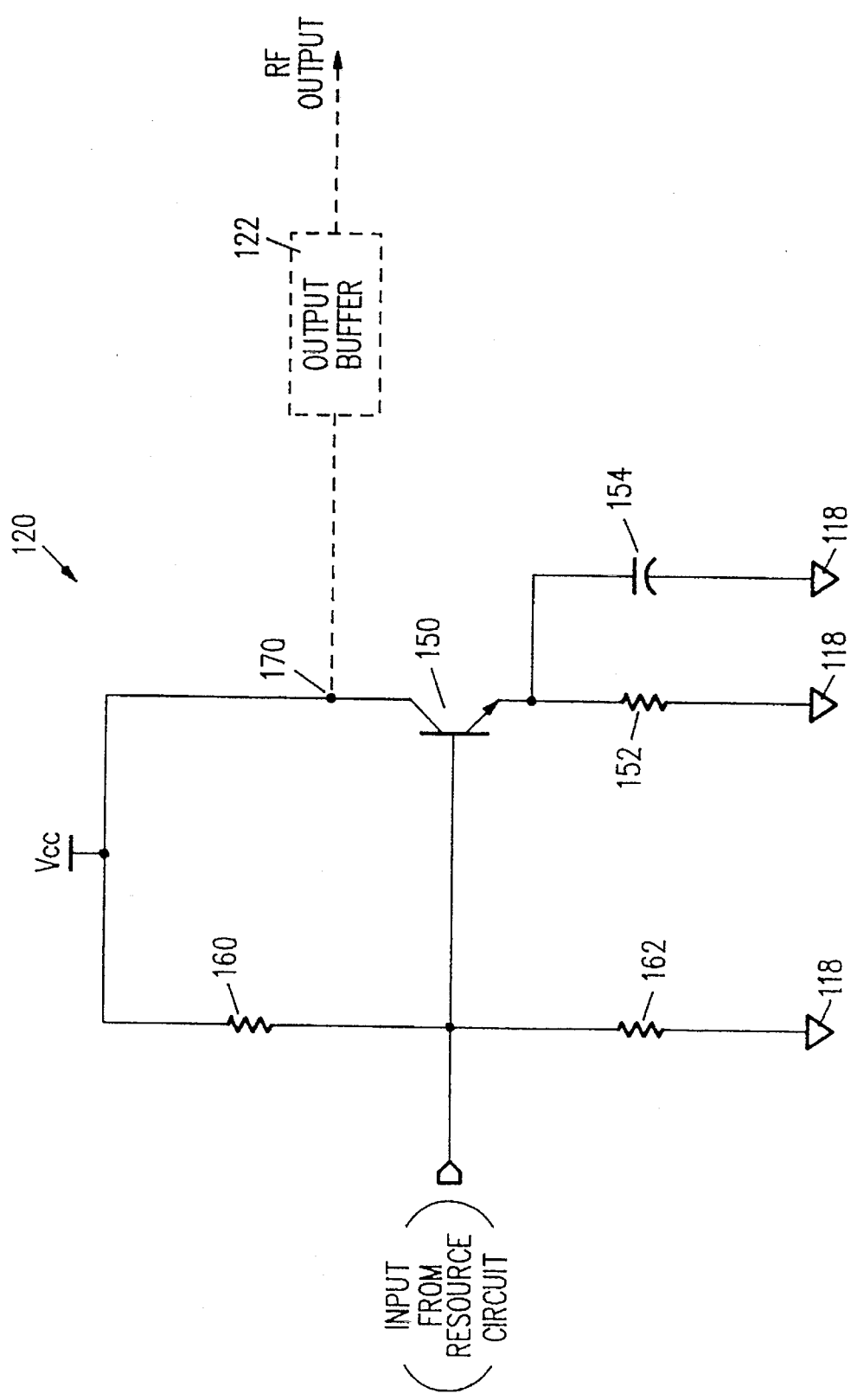
FIG. 7 is a schematic diagram of a preferred embodiment of basic negative resistance cell 120 shown in FIG. 6.
Figure 8:
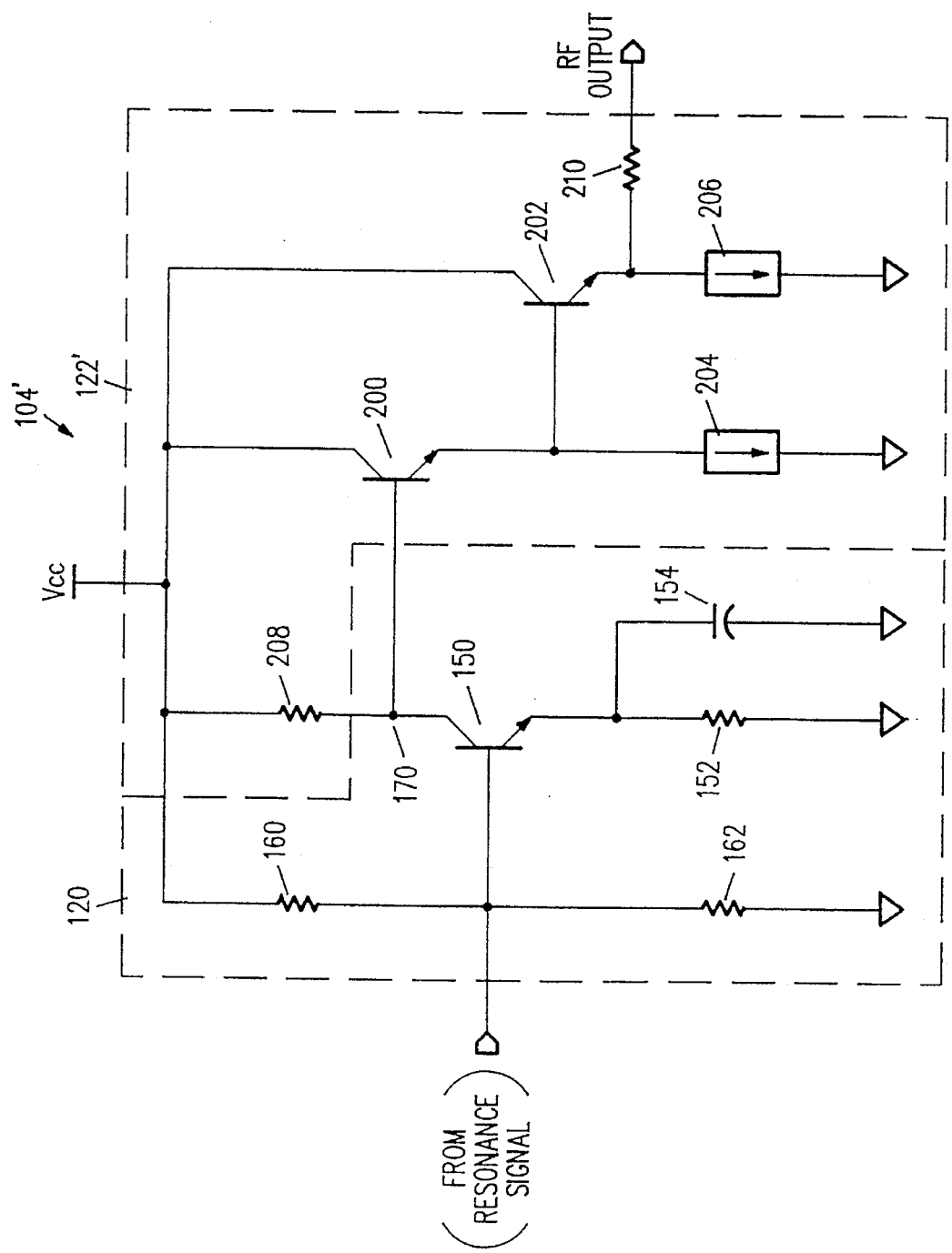
FIG. 8 is a schematic diagram of one conventional approach to buffer the output signal of oscillator 100 having a modified active circuit 104'.
Figure 9:
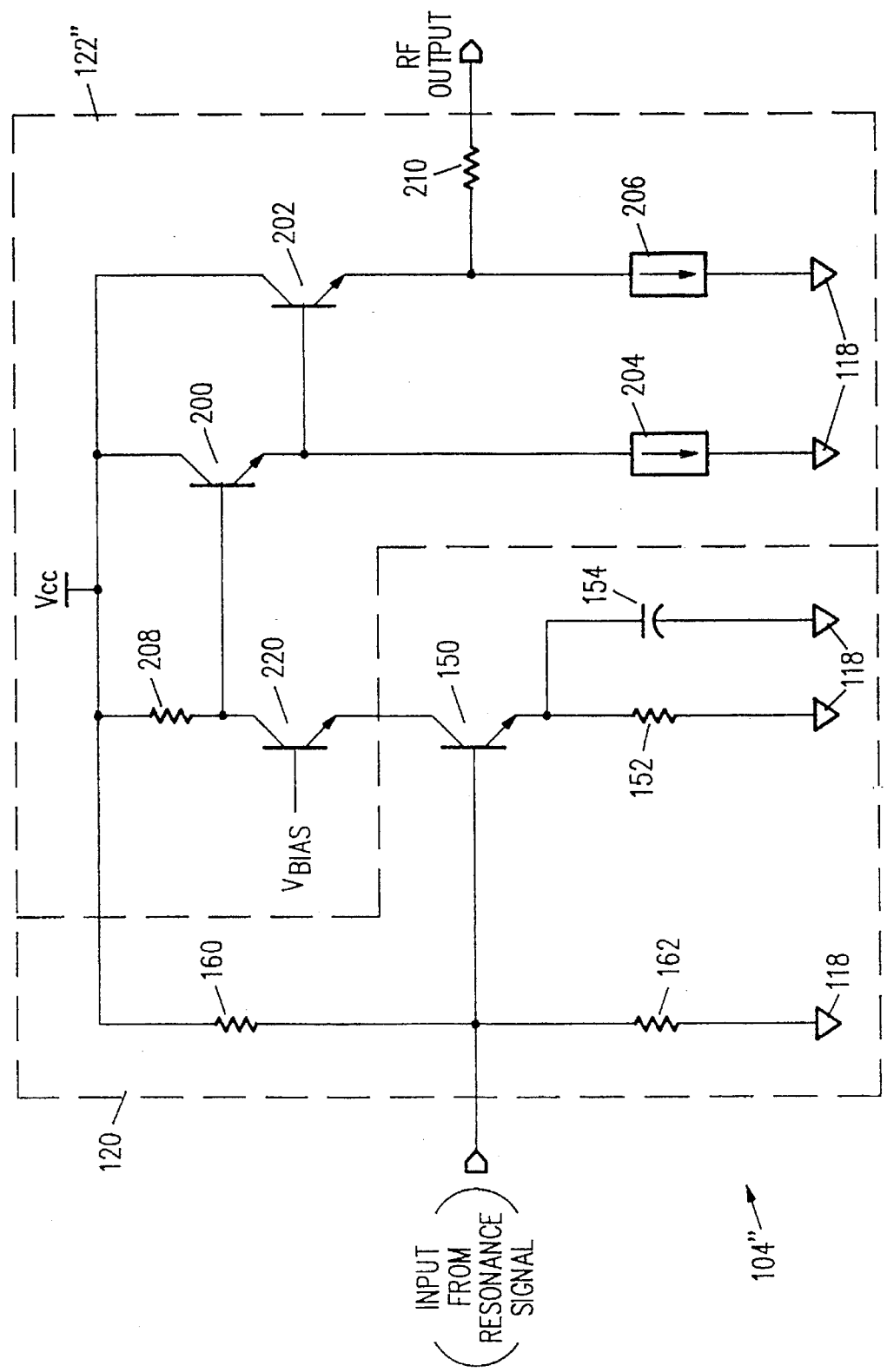
FIG. 9 is a schematic diagram of one conventional approach to buffer the output signal of oscillator 100 having a modified active circuit 104"
Figure 10:
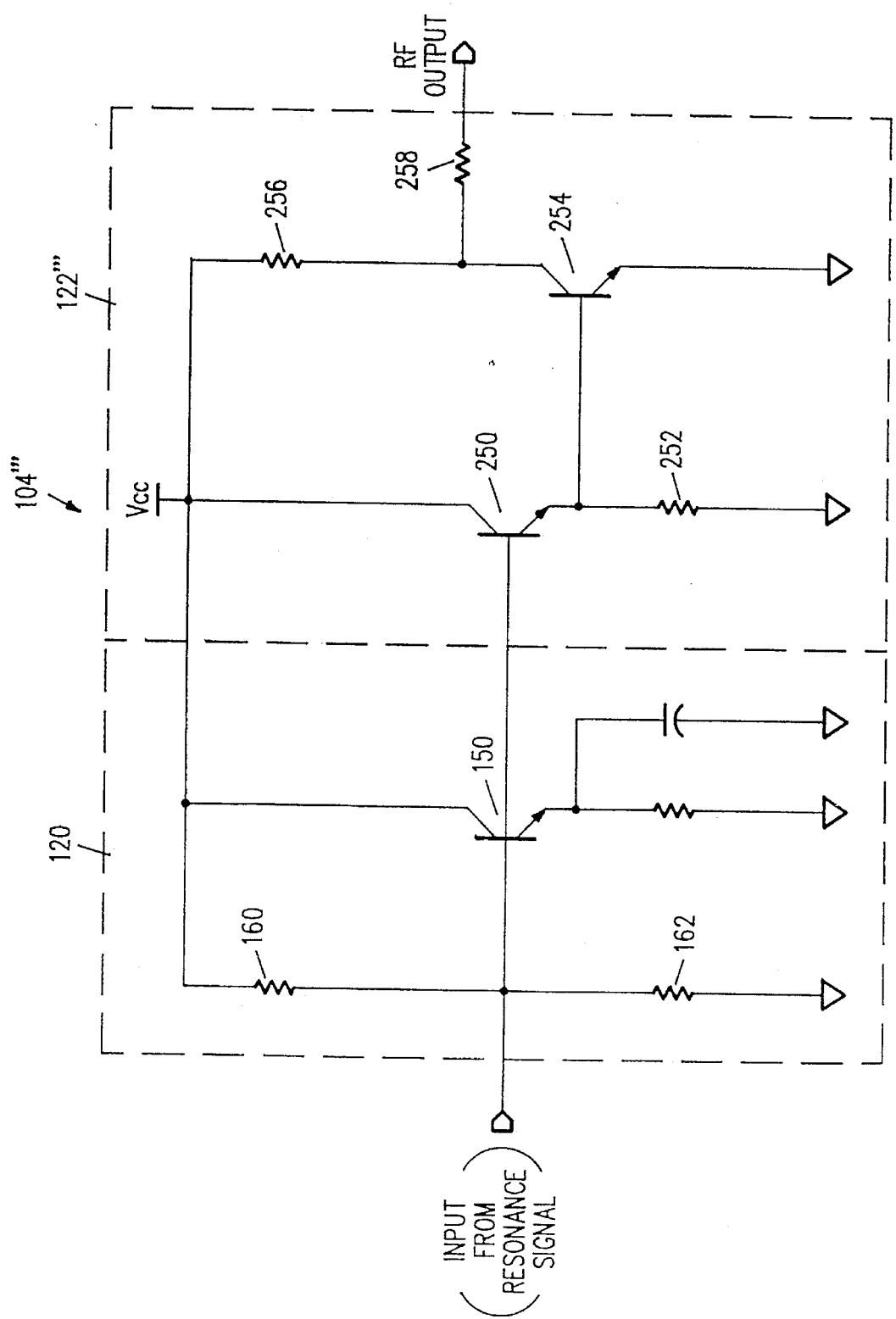
FIG. 10 is a schematic diagram of one conventional approach to buffer the output signal of oscillator 100 having a modified active circuit 104'''

FIG. 1 is a block diagram of a preferred embodiment of a microwave oscillator 10 according to the present invention. The microwave oscillator includes a resonator 12, a negative resistance cell 14, and an output buffer 16. Resonator 12 and negative resistance cell 14 operate as described above to produce a periodic signal having a particular frequency. The negative resistance cell may be an active circuit as shown and described in FIG. 7, or some other active circuit displaying the negative resistance characteristic. In the preferred embodiment, negative resistance cell 14 and output buffer 16, as well as resonator 12, are formed as a single semiconductor substrate. It is possible for resonator 12 to be separate from the other components and actually to be formed of discrete components.

Output buffer 16 taps the periodic signal of resonator 12/negative resistance cell 14 combination directly at resonator 12 through a non-base terminal (either source or drain) of a field effect transistor (FET) 20. FET 20 couples the output buffer 16 to node 22. A gate of FET 20 connects directly to node 22, a drain of FET 20 connects to Vcc and to an input of output buffer 16. A source of FET 20 connects to ground 24. The size of FET 20 is chosen so that the FET can provide adequate gain yet be small enough so as to avoid substantial capacitive loading at node 22. The preferred embodiment employs a FET 20 having a width to length ratio of 20/0.8.

Figure 2:
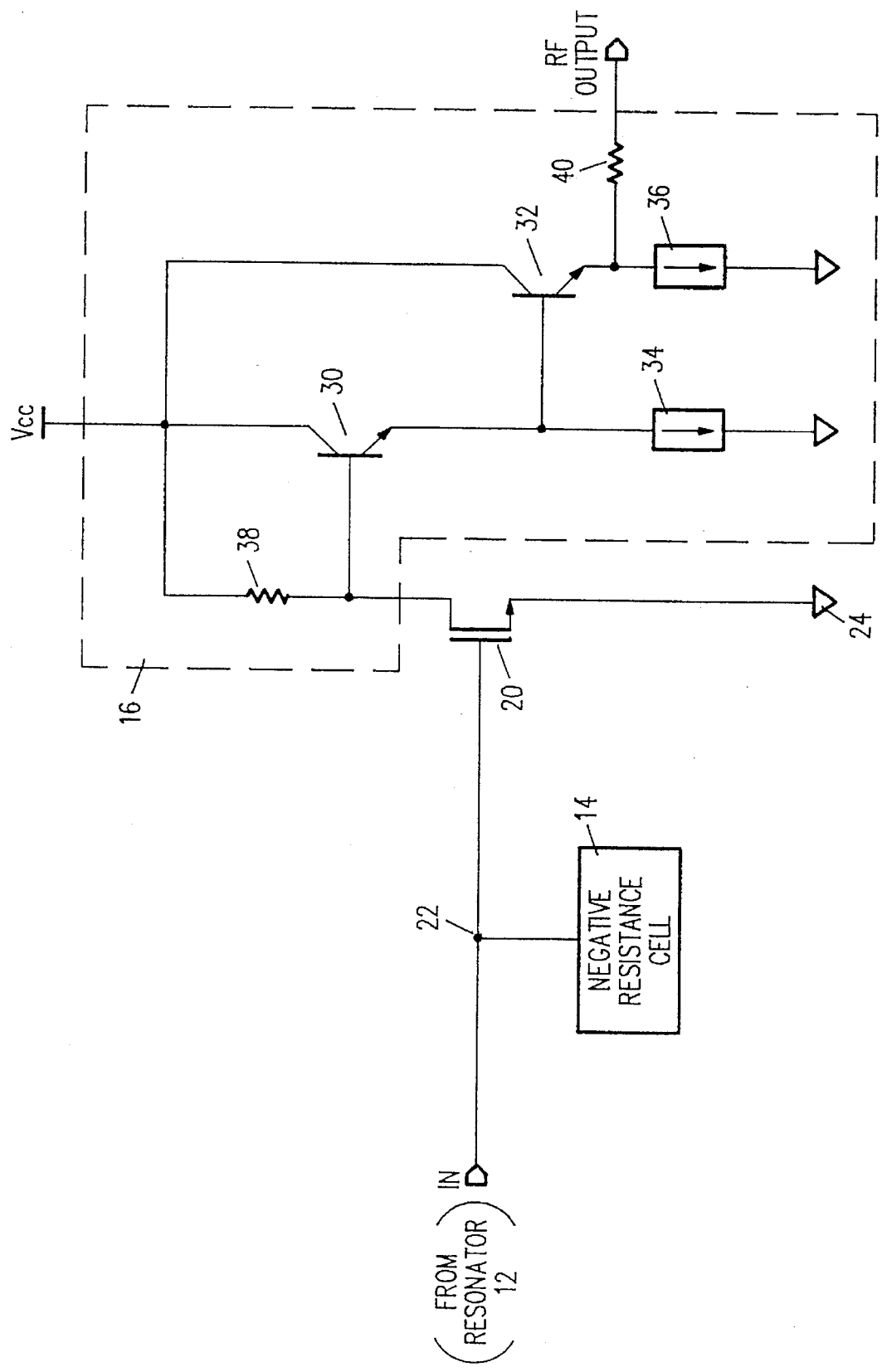
FIG. 2 is a schematic diagram of a preferred embodiment of the present invention.

FIG. 2 is a schematic diagram of a preferred embodiment of the present invention. FIG. 2 shows detail of a preferred embodiment of output buffer 16. Output buffer 16 of FIG. 2 includes an NPN bipolar junction transistor 30, an NPN bipolar junction transistor 32, two current sources 34 and 36, and two impedances 38 and 40. The collectors of transistors 30 and 32 connect to Vcc. The base of transistor 30 connects to the drain of FET 20. Impedance 38 couples the base of transistor 30 to Vcc. Current sources 34 and 36 couple the emitters of transistors 30 and 32, respectively, to ground. Additionally, the base of transistor 32 connects to the emitter of transistor 30. Impedance 40 couples the emitter of transistor 32 to the RF output. Transistors 30 and 32, and their respective current sources 34 and 36, buffer the RF output. Amplification of the periodic signal at node 22 results from the combination of FET 20 and impedance 38. The buffer made up of transistors 30 and 32 serves to provide further power amplification, and allow impedance matching between impedance 38 and the RF output port.

Figure 3:
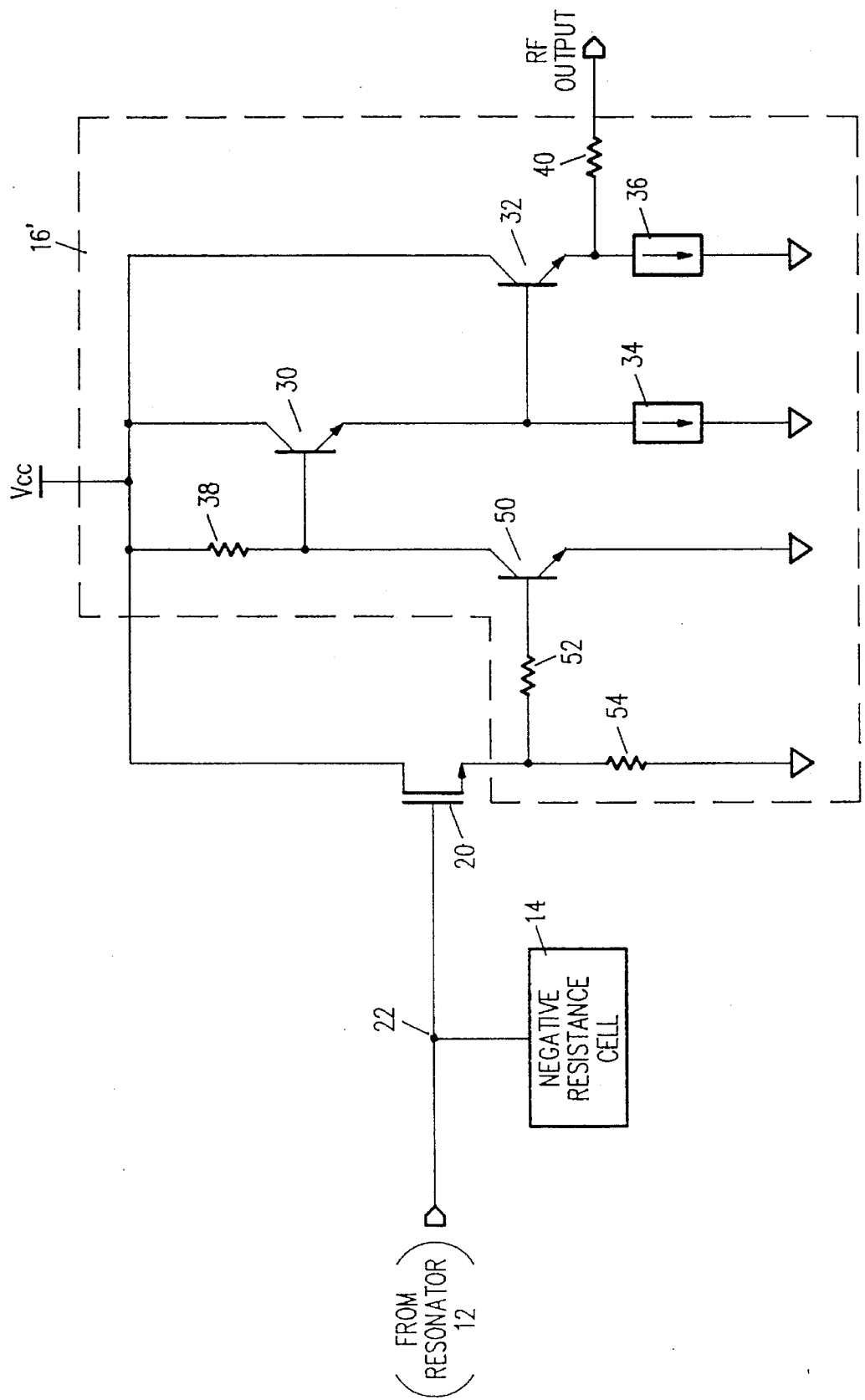
FIG. 3 is a schematic of an alternate preferred embodiment of the present invention.

FIG. 3 is a schematic of an alternate preferred embodiment of the present invention. FIG. 3 includes a different version of output buffer 16 coupled to FET 20. Output buffer 16' includes the basic buffer from output buffer 16 made up of NPN transistors 30 and 32, current sources 34 and 36, and impedances 38 and 40 shown in FIG. 2. The configuration differs in that FET 20 acts as a source follower in driving the combination of an NPN transistor 50 and two impedances, impedance 52 and impedance 54 providing input into the base of transistor 30. Amplification in output buffer 16' is produced from transistor 50.

The collector of transistor 50 connects to the base of transistor 30 and the emitter of transistor 50 connects to ground. Impedance 52 couples the base of transistor 50 to the source of FET 20 and impedance 54 couples the source of FET 20 to ground. The amplifier of output buffer 16' is fairly substantial having a characteristic that the buffer is similar to that in FIG. 2, but includes an additional gain stage formed by NPN transistor 50 and impedance 38. The extra gain stage may provide voltage gain so that FET 20 is a voltage buffer and does not provide voltage gain.

Figure 4:
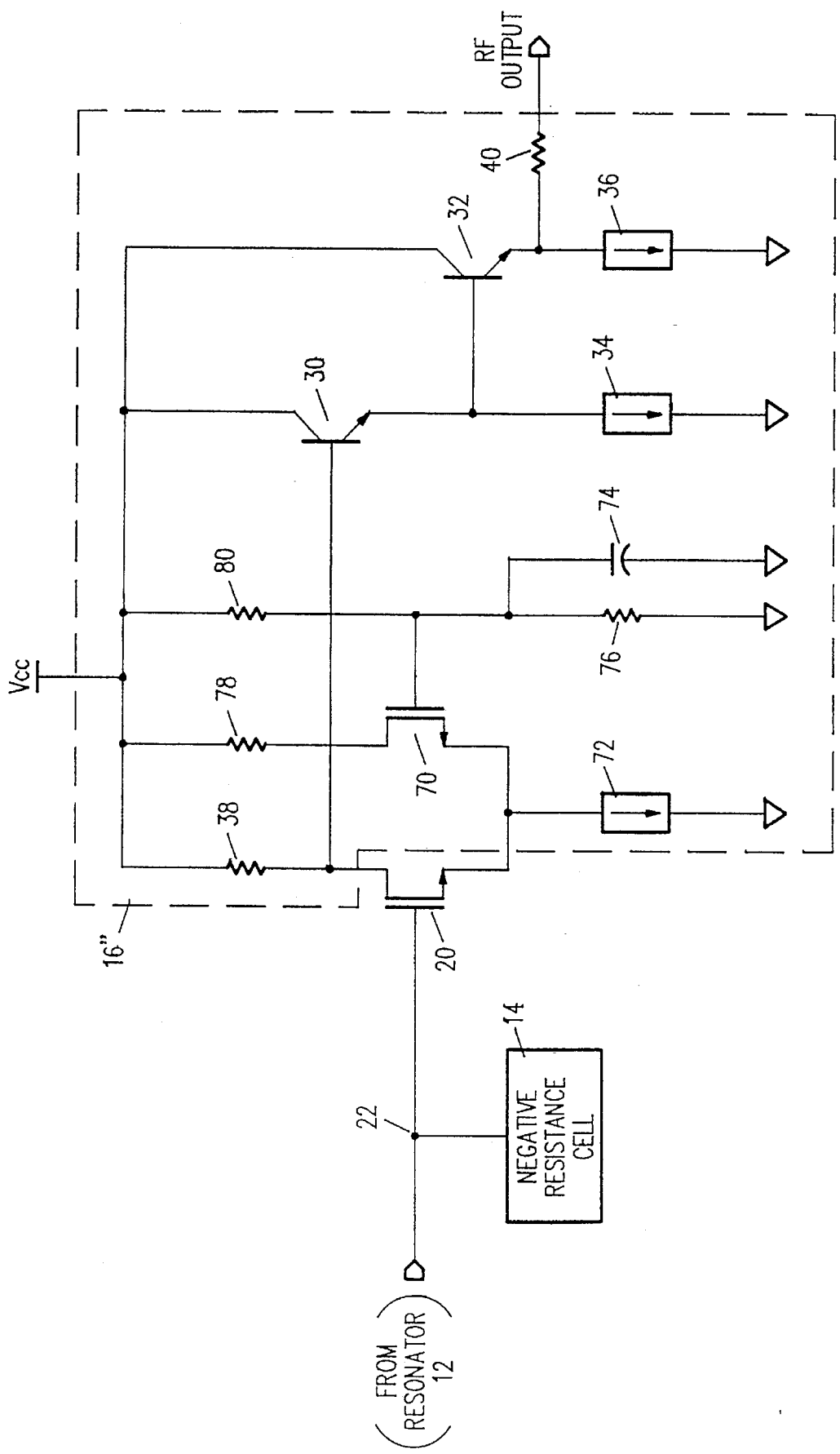
FIG. 4 is a schematic diagram of an alternate preferred embodiment of the present invention having an output buffer 16"
Figure 5:
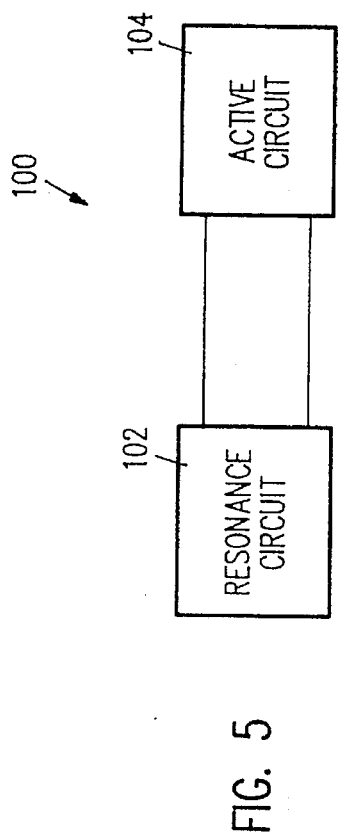
FIG. 5 is a block diagram of a conventional negative resistance oscillator 100 having a resonance circuit 102 coupled to an active circuit 104.
Figure 6:
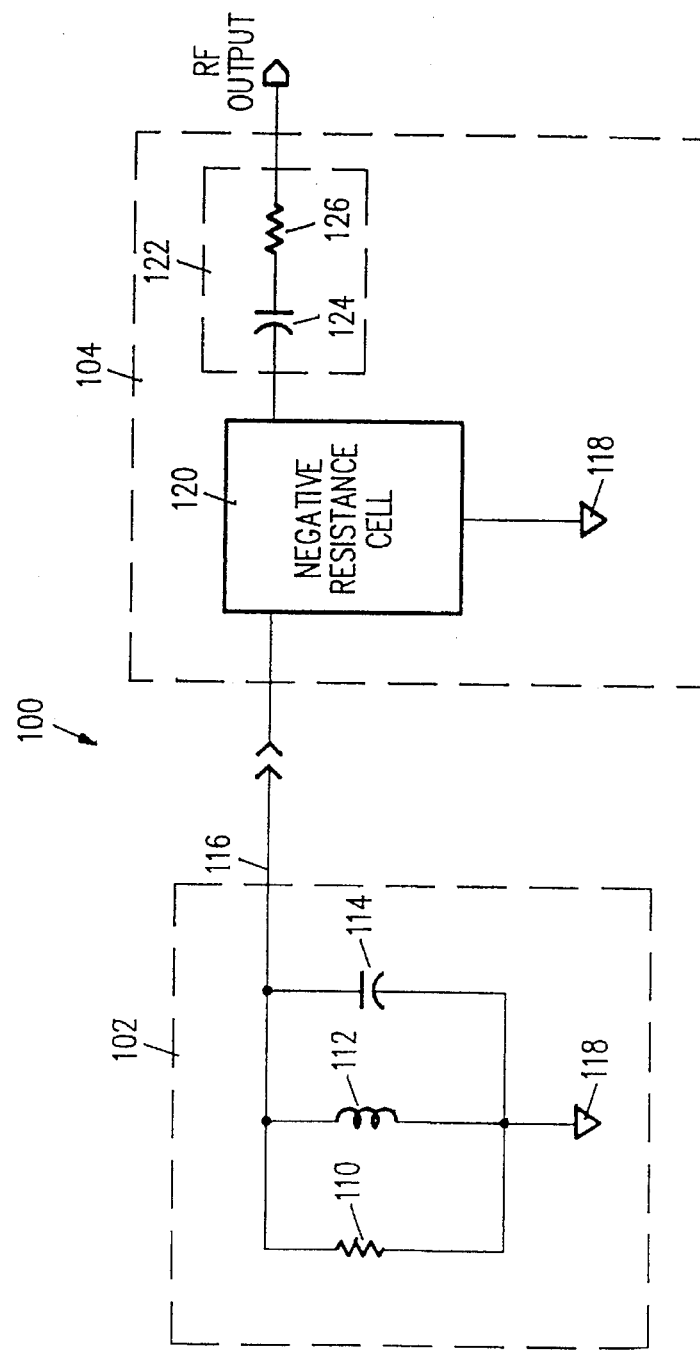
FIG. 6 is a block diagram of oscillator 100 showing further detail.

FIG. 4 is a schematic diagram of an alternate preferred embodiment of the present invention having an output buffer 16". Output buffer 16" includes a differential amplifier including FET 20, impedance 38 previously discussed with respect to FIG. 2 and FIG. 3, as well as additional elements including a MOSFET 70, a current source 72, a capacitance 74, and impedances 76,78 and 80. Impedance 38 and impedance 78 couple the drain of FET 20 and the drain or FET 70, respectively, to Vcc. The sources of FETs 20 and 70 are coupled to each other, and both are coupled to ground through the current source 72. Impedance 80 couples the gate of FET 70 to Vcc, while the parallel combination or capacitance 74 and impedance 76 couple the gate to ground. The base of transistor 30 connects to the drain of FET 20. The differential amplifier provides an output amplitude that is relatively constant irrespective of any input amplitude variation.

The preferred embodiment is extremely well-suited to monolithic construction, since monolithic component matching techniques can be used to establish nearly identical bias voltages at the gates of FET 20 and FET 70. The bias voltages will remain similar independent of process and temperature variations, which will lead to circuit performance that is relatively insensitive to manufacturing tolerances and/or operating conditions.

In conclusion, the present invention provides a simple, efficient solution to a problem or output stability and reduced cost for microwave oscillators. While the above is a complete description of the preferred embodiments of the invention, various alternatives, modifications, and equivalents may be used. Therefore, the above description should not be taken as limiting the scope of the invention that is defined by the appended claims.

What is claimed is:

1. A microwave oscillator including a resonator, comprising:
   a negative resistance cell, formed on a semiconductor substrate, said negative resistance cell including a bipolar transistor having a base coupled to an output of the resonator;
   a field effect transistor formed on said semiconductor substrate and having a gate coupled to said base of said bipolar transistor; and
   an output buffer formed on said semiconductor substrate and coupled to said negative resistance cell through a non-gate terminal of said field effect transistor.

2. A microwave oscillator including a resonator, comprising:
   a negative resistance cell, formed on a semiconductor substrate, said negative resistance cell including a bipolar junction transistor having a base coupled to an output of the resonator; and
   an output buffer formed on said semiconductor substrate, said output buffer including a field effect transistor, said field effect transistor including a gate coupled to said base of said bipolar junction transistor.

3. The microwave oscillator of claim 2 wherein said output buffer includes a differential amplifier.

4. The microwave oscillator of claim 2 wherein said output buffer includes a bipolar junction transistor amplifier, said field effect transistor acting as a source follower in driving said bipolar junction transistor amplifier.

* * * * *